United States Patent [19]

Miller

[11] Patent Number: 5,593,783
[45] Date of Patent: Jan. 14, 1997

[54] PHOTOCHEMICALLY MODIFIED DIAMOND SURFACES, AND METHOD OF MAKING THE SAME

[75] Inventor: John B. Miller, Danbury, Conn.

[73] Assignee: Advanced Technology Materials, Inc., Danbury, Conn.

[21] Appl. No.: 261,807

[22] Filed: Jun. 17, 1994

[51] Int. Cl.$^6$ ........................................... B23B 9/00
[52] U.S. Cl. .................. 428/408; 428/698; 428/704
[58] Field of Search ................................. 428/408, 698, 428/704

[56] References Cited

U.S. PATENT DOCUMENTS

| | | | |
|---|---|---|---|
| 4,869,923 | 9/1989 | Yamazaki | 427/245 |
| 5,137,784 | 8/1992 | Suzuki et al. | 428/408 |
| 5,238,705 | 8/1993 | Hayashi et al. | 427/122 |
| 5,401,283 | 3/1995 | Dyer et al. | 428/408 |

OTHER PUBLICATIONS

Makal'skii et al.; Vliyanie Khim. Fiz.-Khim. Vozdeistv. Svoistva Almazov, pp. 48–54 (1990). [Chem Abstr. CA 115:238158a] "Modification of the Surfaces . . . ".
Loktev et al.; Carbon 29, p. 817 (1991). "Surface Modification of Ultradispersed Diamonds".
Zhu et al., Appl. Phys. Lett. 61, p. 3175 (1992). "Ultraviolet Photo chemical nitridation of GaAs".
"Periodic Table of the Elements", CRC Handbook of Chemistry and Physics, 62nd Ed., 1981, CRC Press, Boca Raton, Florida.
Gladfelter, W. L.; Chem. Mater. 5, p. 1372 (1993) "Selective Metallization by Chemical Vapor Deposition".
Ignatchenko et al., Zh. Prikl. Khim. 64(4), 838–841 (1991). "Surface modification of ultradispersed diamond with hexamethyleneamino . . . ".
Zhidkov, A. B., Izv. Akad. Nauk SSSR, Neorg. Mater. 26(2), 297–9 (1990). "Synthesis of Titanium compounds with nitrogen . . . ".
Danilova et al., Sverkhtverd. Mater. 1989 (5), pp. 34–37 (1989). "Chemical Modification of Diamond Surfaces to Increase the Wear Resistance . . . ".
J. B. Miller, D. W. Brown, submitted to *Langmuir*, 1994. "The Photochemical Modification of Diamond Surfaces".

*Primary Examiner*—Archene Turner
*Attorney, Agent, or Firm*—Janet Elliott

[57] ABSTRACT

Diamond and diamond-like materials having photochemically modified surfaces, and a process for photochemically modifying the surface of diamond and diamond-like materials. Preferably, the substrate to be modified is a single crystal, polycrystalline film or powder of diamond or any silicon carbide polytype. Photochemical modification of the surface enables the addition or exchange of specific surface functional groups. These surface modifiers change the chemical, adhesive and electronic properties of the diamond and diamond-like substrate materials. The modified substrates are useful for producing semiconductor devices for use at high temperatures, high powers, and in otherwise harsh environments.

7 Claims, 3 Drawing Sheets

PHOTOCHEMICALLY MODIFIED DIAMOND SURFACES, AND METHOD OF MAKING THE SAME

GOVERNMENT RIGHTS IN INVENTION

This invention was made with Government support under Contract No. N00014-90-C-0090 awarded by the U.S. Navy. The Government has certain rights in this invention.

BACKGROUND OF THE INVENTION

1. Field of the Invention

This invention relates to diamond and diamond-like materials having photochemically modified surfaces, and a process for photochemically modifying the surface of diamond and diamond-like materials.

2. Description of the Related Art

Diamond is a metastable phase of carbon possessing remarkable mechanical, thermal, chemical, optical, and electrical properties. Not only is it the hardest material known, it is remarkably chemically inert. It has a low coefficient of friction and a high thermal conductivity. Diamond is optically transparent, and its electronic properties as measured by the Johnson or Keyes Figures of Merit are superior to both silicon and the III–V compound semiconductors. These properties make diamond an excellent candidate for use in wear (coating machine tools), tribological (bearings), optical (radomes and laser windows), and electronic (packaging and semiconductor) applications. Problems have been encountered in the control of the interface between diamond and other materials as a consequence of the very inertness of diamond and the difficulties encountered in modification of its surface.

An effective, reproducible method to introduce functionality into the diamond surface has been long sought. Such a method would allow standard organic reactions to be used to convert the introduced functionality into a diverse array of attached organic and organometallic functional groups, with the ability to customize the diamond material for diverse end-use applications.

The advantages to be gained by developing a versatile approach for diamond surface modification are many. Applications that are likely to be immediately amenable to a surface modification approach include improvement in bearing surfaces and adhesion of diamond to a wide variety of materials including metals, insulators, and semiconductors. Modification of the diamond surface to include polar functional groups such as amines or carboxylic acids will permit bonding of polymers, glasses, and window materials. Tribological failures of interacting component surfaces can be minimized by lowering friction and wear. In the case of diamond, it has been shown that the surface structure has a dramatic effect on friction forces generated when a metal contacts the diamond.

The advantageous thermal and electronic properties of diamond lead to the highest figures of merit for any semiconductor material for applications in high power, high speed, high temperature and high frequency applications. Progress in understanding the growth of diamond films has been significant. At the present time, work is underway in many venues directed to understanding and controlling nucleation and growth so as to obtain monocrystalline films on non-diamond substrates. Once usable films are obtained, device development will require that processing techniques suitable for diamond be devised. Because of diamond's extreme chemical resistance, techniques that have been successful for silicon processing are unlikely to be directly transferable to diamond processing. Examples of processing steps that will be affected by the chemically resistant properties of the diamond surface are photolithography, etching, deposition of insulating layers, and preparation of ohmic and rectifying metallic contacts.

Surface modification promises to give microelectronic device processors a chemical "handle" onto the diamond surface, under conditions significantly easier to implement than the current state-of-the-art approaches for bonding to diamond surfaces, that is, carbon or argon ion bombardment and deposition of an adhesion-enhancing metal (e.g. titanium) followed by a high-temperature anneal.

Surface modification also promises to enable the development of useful new diamond-based materials with interesting properties, produced by ordinary chemical reaction with the initial functionalized surface. Diamond surfaces with introduced functionality will have the capability to be derivatized in virtually any way imaginable, using adjustments of standard organic chemical reactions.

In addition, the development of a controlled diamond surface modification technique would allow the use of photolithographic techniques to produce patterned surfaces. Such photolithographic techniques have been well-developed for silicon and, if the lack of reactivity of the diamond surface were overcome, could be used in many semiconductor processing steps such as formation of contacts, optionally self-aligned, and area-selective chemical-vapor deposition, and other juncture and composite structure applications.

A technique for controlled chemical modification of the diamond or diamond-like surface, by which is meant a technique that could be performed reproducibly under relatively mild conditions and by which the percent of reaction could be selected and reproducibly controlled by reaction time or conditions or reagent concentrations, has proven elusive. While the surfaces of most materials are quite reactive, the diamond surface is relatively unique in its surface chemistry and is generally inert to most common chemical reagents. This is apparently due to the fact that most reaction mechanisms for diamond surface modification are precluded by two major factors: (1) the steric bulk of the diamond surface constrains the attack geometry for an incoming reagent to a near surface-normal vector, and (2) the $sp^3$-hybridized carbons of the diamond bulk and the C—H groups presented by the unreconstructed diamond surface are inherently low in reactivity; they offer no useful molecular orbitals for attack by either nucleophiles or electrophiles.

There are in general three exceptions to the chemical inertness of diamond. Diamond is metastable to graphite, the most common allotrope of carbon, and a phase transformation from diamond to graphite can be caused and then the graphite used as the basis for further reactions. The phase transformation to graphite has been effected in many ways: simple heating of diamond, ion bombardment, and by irradiation with high energy or high power laser irradiation. Secondly, the diamond surface may be oxidized. Heating in the presence of $O_2$ graphitizes the diamond surface prior to any further oxidation. Oxidative surface modification may also be accomplished by an etching procedure employing molten alkali nitrates. This technique is hazardous to personnel and is not especially safe or controllable. Thirdly, direct reaction of diamond with a gas-phase reagent under conditions of free-radical reaction can lead to modification of the diamond surface by radical reactions. The radicals which are known to react directly with diamond include hydrogen atoms, fluorine atoms, and chlorine atoms. The diamond surface is unreactive to the molecular species $H_2$, $F_2$, and $Cl_2$. Although molecular $H_2$ and $Cl_2$ are often the reagents used, the reaction conditions required are such that the atomic species are produced and are either very vigorous and corrosive (e.g., $Cl_2/450°$ C.), unsuitable for implementation on a production scale (e.g., fluorine-atom molecular beams), or have proven irreproducible.

All of these approaches for modifying the diamond surface require aggressive conditions, and the extent of surface reaction cannot be readily controlled. Conversion to graphite will cause the loss of many of the advantages offered by diamond. None of these approaches provides a useful technique for controlled chemical modification of diamond surfaces, that could be performed reproducibly under relatively mild conditions and by which the percent of reaction could be selected and reproducibly controlled by reaction time or conditions or reagent concentrations.

Such a controlled surface modification method would introduce a functional group onto the diamond surface which could be reacted via standard organic reactions, e.g., alkylation, acylation, etc., to convert the introduced functionality into a diverse array of attached organic and organometallic functional groups. Amine groups would be highly useful as the introduced functional groups, since they can be reacted to give a diverse array of products. The amine-terminated diamond surfaces could therefore be derivatized in numerous ways useful in the many applications for which diamond is uniquely suited by virtue of its special physical and electronic properties, by many of the standard reactions of organic chemistry:

The amine groups of the modified diamond can also serve as "anchors" for coupling reagents, spacer arms, etc. For example, amine groups can be reacted with bifunctional molecules such as $ICH_2(CH_2)_nC(CH_3)_2$—$N_3$:

The azide functional group can be used in further reaction steps, for example, to immobilize enzymes, antibodies, and other biomolecules on the diamond surface, for service in biosensors, biocatalysts, and other biochemical applications. The azide group may be reduced to an amine under mild conditions, providing amine functional groups that are not subject to the steric constraints of amine groups directly bonded to the diamond surface carbons. Amine-terminated surfaces are suitable for performing protein immobilizations via very mild carbodiimide activation of carboxy groups. For example, very effective coupling reactions can be performed at pH 5.0–6.0 in the presence of low concentrations of the carbodiimide activating agent. As further examples, glycoproteins or glycopeptides are immobilized on a solid phase by (1) opening glycol rings in the sugar chain of the glycoproteins to form aldehyde groups, and (2) binding of the aldehyde groups to the amine groups of a hydrophilic spacer on the surface of the solid phase. Such immobilized biomolecule compositions could take advantage of the properties of diamond and any electronic circuitry formed in or on the diamond substrate.

Successful amination of diamond surfaces has not been reported. Heating or ultraviolet/visible photolysis of ammonia or amines in the presence of hydrogen-terminated diamond does not produce reaction of ammonia or amines with the diamond surface—the diamond surface is simply too inert.

Previous reports had appeared that claimed that thermal ammonia treatment of a chlorinated diamond surface led to an aminated diamond surface. These reports, by the same authors—the first, in Russian (Makal'skii, V. I.; Loktev, V. in Bogatyreva, G. P., ed. *Vliyanie Khim. Fiz.-Khim Vozdeistv. Svoistva Almazov* (Akad. Nauk Ukr. SSR, Inst. Sverkhtverd. Mater.: Kiev, USSR, 1990) pp. 48–54), the second, in English, ("Surface Modification of Ultradispersed Diamonds," Loktev, V. F.; Makal'skii, V. I.; Stoyanova, I. V.; Kalinkin, A. V.; Likholobov, V. A.; Mit'kin, V. N. *Carbon* 29 (1991) 817)—reported similar work and claimed that the diamond surface could be aminated by heating a chlorine-terminated diamond surface in the presence of ammonia. These reports were inconsistent with each other and did not present sufficient spectroscopic evidence to support surface amination. The spectroscopic evidence presented in fact was supportive of a hydrogen-terminated diamond surface, rather than an amine-terminated one, confounded by a great deal of contamination by surface hydroxyl and carboxyl moieties. Because these results conflicted with the findings of the inventor, the thermal amination of a chlorine-terminated diamond surfaces was attempted by the methods of the Russian authors, with careful spectroscopic analysis to determine whether amination had actually occurred (see Example 11 below).

Limited photochemical reaction of the gallium arsenide surface has been reported. Monolayer nitridation of the GaAs surface was achieved in ultrahigh vacuum by exposing a half monolayer of $NH_3$ on the surface (at 102K) to 60 minutes of irradiation with 6.4 eV (193 nm) photons from a pulsed excimer laser (Zhu, X.-Y.; Huett, T.; Wolf, M.; White, J. M. *Appl. Phys. Lett.* 61 (1992) 3175). This process is a result of nonthermal photodissociation of adsorbed ammonia, and surface —$NH_2$ is an important intermediate in the nitridation.

This approach, however, requires very vigorous reaction conditions, and does not stop at an amine-terminated surface but proceeds to form a monolayer of GaN. Such an approach is not carried out under mild conditions and does not provide a controllable extent of reaction. Furthermore, the diamond surface is so inert that extremely high energies would be required to break the carbon-hydrogen bonds that terminate the unreacted surface. Such a result has not been reported. A useful method for controlled amination of diamond surfaces must therefore be characterized by a greater selectivity and operability under milder conditions.

Accordingly, it is an object of the present invention to provide a method for controlled chemical modification of diamond surfaces via amination, and methods for further derivatizing or patterning such chemically modified surfaces.

It is another object of the invention to provide such a method which is useful not only for diamond, the most difficult case, but also for related materials from Group IV of the Periodic Table, such as silicon, germanium, germanium carbide, and all polytypes of silicon carbide.

Other objects and advantages of the invention will be apparent from the ensuing disclosure and appended claims.

SUMMARY

In one aspect, the present invention relates to diamond and related diamond-like materials having photochemically modified surfaces, wherein the diamond or diamond-like material is a bulk single crystal, single crystal or polycrystalline film, or powder of diamond, any silicon carbide polytype, silicon, germanium, or germanium carbide, and the surface is terminated by amine groups, $NR_2$, where each R is independently H, substituted or unsubstituted hydrocarbyl, azine, or sulfonamide.

In a further aspect, the present invention relates to a process for photochemically modifying the surface of diamond or diamond-like materials, wherein the surface is reacted photochemically with a halogen, using light in the ultraviolet-to-visible wavelength ranges, for a sufficient period of time and at a sufficient light intensity to cause at least some of the carbon-hydrogen bonds on the surface to react to form a halogen-terminated surface.

In yet a further aspect, the present invention relates to a process for photochemically modifying the surface of diamond or related diamond-like materials, wherein the surface is reacted either thermally or photochemically with a halogen to form a halogen-terminated surface, and the halogen-terminated surface is photolyzed in the presence of ammonia or an amine, $NHR_2$, where each R is independently H, substituted or unsubstituted hydrocarbyl, azine, or sulfonamide, using light in the ultraviolet-to-visible wavelength ranges, for a sufficient period of time and at a sufficient light intensity to cause at least some of the halogen substituents to react with the ammonia or amine to produce an amine-terminated surface.

In yet another aspect, the present invention relates to methods for preparing a variety of functionally derivatized surfaces of diamond and diamond-like materials, wherein the amine groups of amine-terminated surfaces prepared by the photochemical amination method of the present invention are reacted by modifications of standard organic chemical reactions to produce a diverse array of attached organic and organometallic functional groups.

Other aspects and features of the invention will be more fully apparent from the ensuing disclosure and appended claims.

DETAILED DESCRIPTION OF THE INVENTION, AND PREFERRED EMBODIMENTS THEREOF

There are a limited number of ways to chemically attack the extremely inert diamond surface. One approach that does result in a surface reaction is free radical reaction with halogens, as described above. However, under standard reaction conditions of heat and reagent concentration, the halogenated diamond surface does not react to become further derivatized but typically either remains unreacted or reverts to the hydrogen-terminated surface. The method of the present invention uses photochemical amination, under mild conditions, of a pre-reacted (i.e. halogenated) diamond or diamond-like material surface to introduce amine functional groups at the diamond surface.

Figure 1:
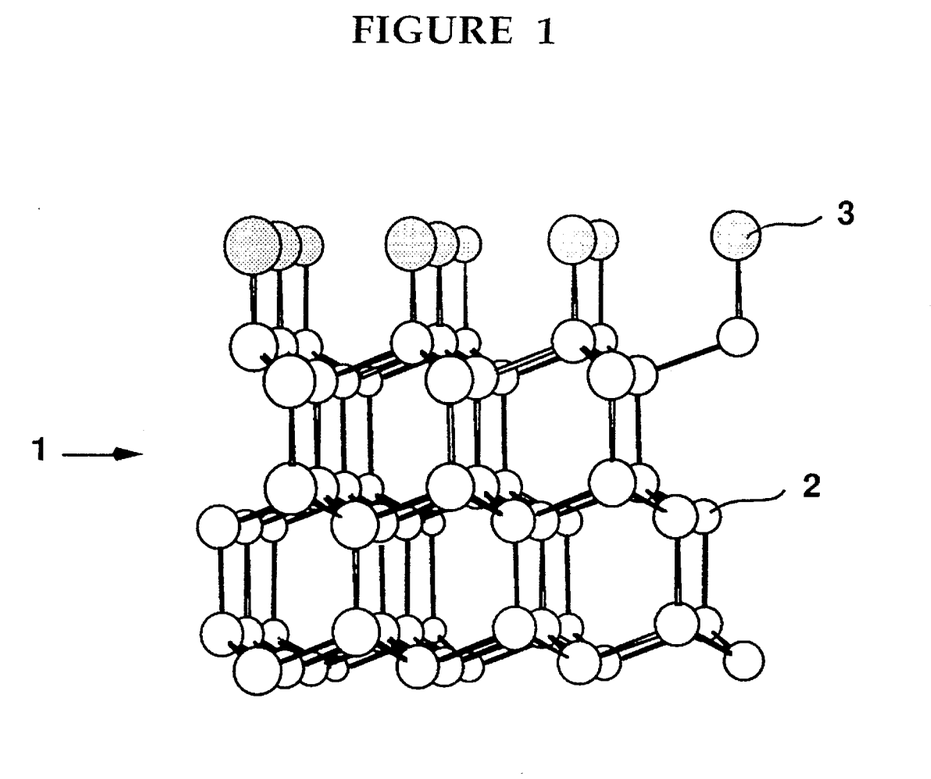
FIG. 1 shows a "ball-and-stick" diagram of a chemically modified diamond (111) surface 1, wherein 2 represents a carbon atom of the diamond lattice, and 3 represents a heteroatom or heterogroup such as a halogen atom or amino (—$NH_2$) group.

FIG. 1 shows a "ball-and-stick" diagram of a chemically modified diamond (111) surface 1, wherein 2 represents a carbon atom of the diamond lattice, and 3 represents a heteroatom or heterogroup such as a halogen atom, amino (—$NR_2$, where each R is independently H, substituted or unsubstituted hydrocarbyl, azine, or sulfonamide) group, —OR (where R is H or hydrocarbyl) group, or —SR (where R is H or hydrocarbyl) group. In diamond surfaces modified by the method of the present invention, the heteroatom or heterogroup may be introduced in a low or a high concentration on the surface, depending on the reaction conditions selected. The heteroatoms or heterogroups may be put on the surface in patterns, in any suitable manner, e.g., using the photolithographic approaches that have been developed for and are well-known in the semiconductor industry.

The amine-terminated diamond surface serves as a highly useful intermediate for further derivatization. The standard techniques of alkylamine chemistry are advantageously applied, including ammonium-salt formation, alkylation, and amide generation. These synthetic routes are usefully employed in linking various molecules to the diamond surface. In addition, although diazonium salts of primary aliphatic amines are generally unstable, the steric bulk and rigid lattice of the diamond substrate may permit the diazonium salt to be formed, in turn allowing substitution by cyano- or hydroxyl-groups.

The method of the present invention is described in the context of modification of diamond surfaces, but it should be understood that in a sense diamond is merely the most difficult case. The method of the present invention is also useful for providing amine-terminated surfaces of other related materials, including diamond-like materials, viz., silicon, germanium, germanium carbide, and all polytypes of silicon carbide. These materials, from Group IV of the Periodic Table, are referred to herein as "diamond-like"

materials, to denote their relationship to diamond and usefulness in the application of the present invention, though of course they do not present surfaces nearly so inert as does diamond. It will be understood by those skilled in the art that, in applying the method to the other diamond-like materials, the reaction conditions of temperature, reagent concentration, photon energy and light source intensity and duration will be modified to account for the different surface reactivities of these different materials, and in fact also to account for the differential reactivities of faces presenting different crystallographic orientations of these materials. E.g., it is expected that the silicon surface of SiC will be more reactive than a carbon surface thereof.

The diamond or diamond-like materials whose surfaces are desired to be modified by the method of the present may be in any physical form suited for their end-use application. Powders, films or bulk materials, in single crystal, polycrystalline, or amorphous forms, may be utilized as substrates in the practice of the invention.

Figure 2:
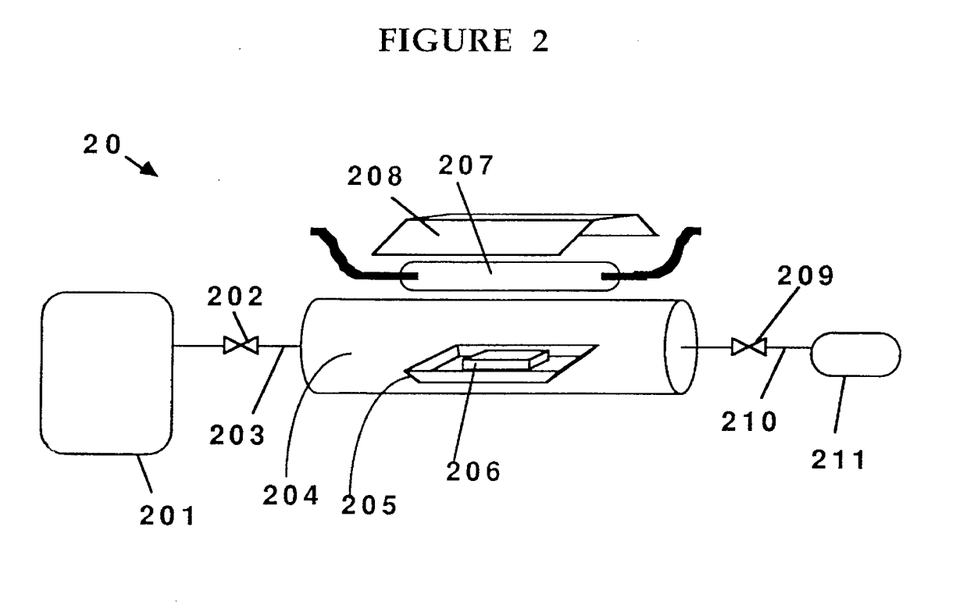
FIG. 2 shows a schematic representation of an apparatus for photochemical surface modification of substrate materials.

A reactor such as is shown schematically in FIG. 2 may be used to carry out the reactions of the present invention, although any equipment set-up that provides delivery of gaseous reagents, control of temperature, and light exposure of the substrate will be appropriate.

In the reactor system 20 of FIG. 2, gases are supplied from a gas manifold 201, which controllably provides halogen, ammonia or amine, and optionally other gaseous or vapor-phase reagents for further derivatization, and any desired inert carrier or purge gas such as helium, neon, argon, krypton or xenon. The gases flow through gas flow conduit 203 and gas flow control valve 202 to reactor chamber 204, where they encounter substrate 206, which is presented on a support 205 which may be a boat, a pedestal, or any other means appropriate to the physical state—e.g, powder, film, bulk material, etc.—of the substrate. The support 205 should be made of a refractory material that can withstand the corrosive conditions and high temperatures that may be present in the reactor chamber, e.g., platinum, alumina, quartz, etc. Light source 207, provided with an optional reflector 208, is positioned appropriately to expose the substrate to radiation of the desired wavelengths. Unused reactant gases or vapors and any vapor-phase by-products are swept out of the reactor chamber via gas flow conduit 210 and gas flow control valve 209, to gas disposal unit 211, which may be a scrubber, a stack, a combustion chamber, or any other means appropriate to the gases evolved and the environmental and safety constraints they present.

The basic approach to photochemical amination begins with the preparation of a halogen-terminated diamond surface, which may be prepared by thermally or photochemically induced reaction of halogen gas with the diamond surface. To begin, diamond powders as received may contain oxygen or other impurity atoms at the surface. To prepare a clean, hydrogen-terminated surface, the diamond is heated under vacuum, typically less than $1 \times 10^{-4}$ torr, with slow heating, in the range of 1 to 100° C.min$^{-1}$, with about 10° to 15° C.min$^{-1}$ preferred, to temperatures in the range of 850° to 1000° C., with about 900° C. to 950° C. preferred, with constant pumping. The substrate material is maintained at this elevated temperature and reduced pressure for a time sufficient to desorb essentially all non-hydrogen impurity atoms, typically 0.1 to 2 hours, then allowed to rapidly cool to room temperature or alternatively taken directly to the temperature at which the next step will take place.

The clean, hydrogen-terminated diamond surface is then exposed to the halogen gas $X_2$ under conditions which will promote formation of reactive X.radicals, which react with the C—H groups on the diamond surface to yield C—X moieties. The halogen may be selected from fluorine, chlorine, bromine and iodine, with chlorine and bromine preferred because of their ease of handling, the easy access of conditions for radical formation, and the relative thermodynamic stability of the C—Cl and C—Br bonds.

For reaction with thermally-generated halogen radicals, the hydrogen-terminated diamond surface should be heated in an atmosphere wherein the partial pressure of the halogen gas ranges from $10^{-6}$ to 1500 torr, with 10 to 1000 torr preferred. An inert gas, such as helium, argon, etc., may be used as a diluent to permit reaction at a pressure higher than the partial pressure of the halogen. The temperature of the system should range from 100° to 700° C., depending upon the halogen gas used. The preferred temperature for chlorination is in the range 375° to 450° C. Use of fluorine requires higher temperatures, and bromine and iodine require lower temperatures. The reaction time, temperature and halogen pressure will determine the extent of surface halogenation. Under the preferred conditions, maximal chlorination should occur in under five hours.

The spacing of chemical functional groups on a fully-modified diamond surface is determined by the dangling-bond density of the exposed crystal faces. For example, on the (111) surface, there is one dangling bond per 5.36 Å$^2$. In turn, the spacing between two adjacent functional groups is 2.49 Å. At lower coverages, the spacing between neighboring C—X groups will be statistically determined. Thermally halogenating the surface in specific areas is possible by depositing a chemically resistant physical mask, such as a metal film or appropriate photoresist, onto the diamond prior to halogenation. This technique may necessitate removal of the masking layer after modifying the surface.

For reaction with photochemically-generated halogen radicals, the hydrogen-terminated diamond surface should be irradiated with actinic radiation under an atmosphere wherein the partial pressure of the halogen gas ranges from $10^{-6}$ to 1500 torr, with 10 to 1000 torr preferred. An inert gas, such as helium, argon, etc., may be used as a diluent to permit reaction at a pressure higher than that of the halogen. The temperature of the substrate should be somewhat below the decomposition temperature of the halogenated diamond, with a temperature differential of 15° to 35° C. preferred. The incident photon energy should be near or above the absorption maximum of the halogen being used. For fluorine and chlorine, a high-pressure mercury arc lamp is sufficient, while for bromine and iodine, lower energy radiation is satisfactory. Coherent or monochromatic light sources are also usefully employed. The irradiation time, radiation flux, temperature and halogen pressure determine the extent of surface halogenation.

Similarly to the thermally-induced reaction, the distribution of photochemically reacted surface halogen at full coverage is determined by the diamond lattice spacing. At lower coverages, the spacing between neighboring C—X groups is again statistically determined. However, with the photochemical halogenation method, the area to be reacted with the halogen gas may be directly patterned on the surface, using photo-masking techniques similar to those that have been developed for the semiconductor industry, thereby eliminating the need for a physical barrier. The degree to which the border between modified and unmodified areas is sharply defined is determined by reagent gas pressure, total pressure and irradiation conditions.

To prepare the amine-terminated diamond, a halogen-terminated diamond surface, which has been prepared by any method, is then exposed to an amine $NHR_2$, where each R is independently H, substituted or unsubstituted hydrocarbyl, azine or sulfonamide, under visible to ultraviolet radiation. Illumination with such actinic radiation is usefully accomplished with a high-pressure mercury arc lamp, coherent or monochromatic light sources. The incident photon energy should be near or above the absorption maximum of the amine being used. The partial pressure of the amine may range from $10^{-6}$ to 1500 torr, with 10 to 1000 torr preferred. An inert gas, such as helium, argon, etc., may be used as a diluent to permit reaction at a pressure higher than that of the amine. The temperature of the substrate should be somewhat below the decomposition temperature of the amine-terminated diamond, with a temperature differential of 15° to 35° C. preferred.

The $NHR_2$ amination reagent may be selected from a broad group consisting of ammonia and primary and secondary amines, optionally substituted with groups which are stable to the conditions of the photolytic amination. Useful R groups include $C_1$–$C_{18}$ alkyl, $C_2$–$C_{18}$ alkenyl, $C_6$–$C_{20}$ aryl, and $C_3$–$C_{18}$ cycloalkyl, and may include functional groups such as azine and sulfonamide, which can survive the photolytic amination conditions and which are useful for subsequent further derivatization steps.

The amination reagent may comprise an amino-substituted "sandwich" compound, such as aminoferrocenes or aminochromocenes. Such compounds are extremely stable, and derivatization of the diamond or diamond-like material surface with these moieties provides opportunities to fabricate non-linear optical materials, Such reagents are selected from the group consisting of $(\theta\text{-}C_5H_5)M(\theta\text{-}C_5H_4(CH)_n NH\text{---})$ and $(\eta\text{-}C_6H_6)M(\eta\text{-}C_6H_5(CH)_n NH\text{---})$, where M is transition metal and n ranges from 1 to 8. The metal is desirably selected from the group consisting of metals from group VIB, VIIB, and VIIIB of the Periodic Table (CRC Handbook of Chemistry and Physics, 62nd Ed., 1981, CRC Press, Boca Raton, Fla.). The length of the $(CH)_n$ spacer is important to avoid steric hindrance; n should be at least 1.

The distribution of the surface amine will be primarily determined by the distribution of the precursor surface halogen, since the hydrogen-terminated diamond is reactive to amine under photolytic conditions. However, the areas that are reacted with the amine may also be further selected by irradiating the surface through a photomask.

As noted above, the spacing between two adjacent functional groups on the fully modified diamond (111) surface is 2.49 Å. In the case of an aminated diamond surface, this spacing means that the distance between the nitrogen of one amino-group and the closest hydrogen of a neighboring amine functionality is slightly greater than 1.75 Å—close enough for hydrogen bonding to occur; this is verified by the relatively low frequencies of the N—H stretching modes (in the vicinity of 3150 and 3050 $cm^{-1}$) in the infrared spectra of the fully aminated diamond shown in traces C and D of FIG. 4. As used in such context, the phrase "in the vicinity of" means within $-50\ cm^{-1}/+250\ cm^{-1}$ of the numerical values of the IR spectral peak (in $cm^{-1}$) being specified. Aminated diamond with lower surface amine concentrations will exhibit higher N—H stretching frequencies, up to about 200 to 250 $cm^{-1}$ above the values for fully aminated diamond surfaces. For comparison, the N—H stretching modes of a typical amine on a tertiary carbon, such as tert-butyl amine are observed at 3350 and 3280 $cm^{-1}$; 1-adamantylamine exhibits similar N—H stretching frequencies.

For some potential applications of surface-modified diamond, it is desirable to limit the surface loading of the functional groups. By increasing the inter-group spacing, hydrogen-bonding on the surface may be decreased, effectively increasing the nucleophilicity and/or Lewis basicity of the surface amines. Furthermore, producing a more sparsely functionalized surface would permit subsequent reaction with bulky reagents, such as biomolecules, yet would limit the amount of unreacted surface amine, thereby preserving the inherently low reactivity of the unmodified diamond.

The useful concentration range for amination of the surface of diamond or diamond-like material ranges from about $2\times10^{12}$ to about $2\times10^{15}$ amine functional groups per $cm^2$ of said surface. The higher figure is at or close to the saturation value for diamond surfaces, while the lower range of concentrations have utility for attachment of large functional groups such as peptides, proteins, antibodies, enzymes, glycoproteins, and glycopeptides, either directly or via well-known crosslinking reagents.

As describe above, the amine-terminated diamond or diamond-like material surface may be reacted with a variety of additional chemical reagents to further modify the diamond surface and thereby change its chemical nature. An amine-terminated diamond or diamond-like material surface, denoted $C^*\text{---}NH_2$, may be reacted with an alkyl halide, $R_2CH\text{---}X$, where R is H or hydrocarbyl and X is chlorine, bromine or iodine, to produce a diamond surface alkyl amine, $C^*\text{---}NHCHR_2$. This alkylation may be performed in the gas phase or employing either neat or dilute alkyl halides. The amine terminated diamond or diamond-like material surface may also be reacted with a gas-phase or solution acyl halide, $R\text{---}(C\!=\!O)\text{---}X$, where R is H or hydrocarbyl and X is chlorine or bromine to form a diamond surface amide, $C^*\text{---}NH\text{---}(C\!=\!O)\text{---}R$. The reaction of the amine-terminated diamond or diamond-like material surface with nitrous acid, $HNO_2$, in aqueous solution produces a diamond surface diazonium ion, $C^*\text{---}(N\!=\!N)^+$. The amine-terminated diamond or diamond-like material surface may be reacted with an alkyl sulfonyl chloride, $R\text{---}(SO_2)\text{---}Cl$, where R is hydrocarbyl, to produce a diamond surface sulfonamide, $C^*\text{---}NH\text{---}(SO_2)\text{---}R$. The amine group of the amine-terminated diamond or diamond-like material surface also may be derivatized in a large number of other useful ways, using adjustments of standard organic chemical reactions.

Figure 3:
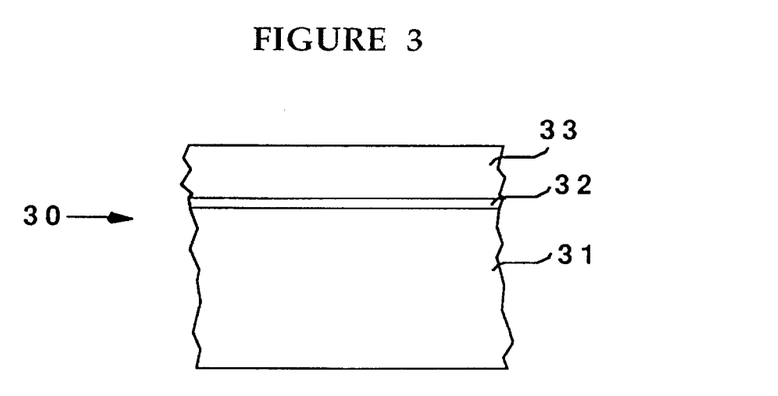
FIG. 3 shows a schematic representation of a metal contact deposited onto a photochemically modified surface.

The structure 30 shown in FIG. 3 schematically depicts a material overlayer 33 formed on the surface-modified diamond or diamond-like material substrate 31. The substrate 31 represents any form of diamond or diamond-like material, either film or bulk material, single crystal or polycrystalline. The chemical nature of the surface-modifying monolayer 32 will influence the chemical, adhesive and electrical interactions of the diamond or diamond-like material substrate with an overlayer 33, whether metal, insulator or semiconductor.

Metallization of the surface for contacts or other purposes may be effected on the modified diamond or diamond-like material surface by physical vapor deposition, chemical vapor deposition, or other means that have been developed for and are well-known in the semiconductor industry. The metal may be patterned using a physical mask, such as a shadow mask or patterned photoresist techniques, with or without subsequent physical or chemical etching steps for removal of metal in undesired areas.

The Lewis basic properties of the amine-terminated diamond may also be used as nucleation centers for area-selective chemical vapor deposition. For example, certain organometallic and inorganic chemical vapor deposition precursors, e.g. Cu(L)(bdk), where L is a phosphine, alkene, or other two-electron donating ligand and bdk is a β-diketonate ligand, will coordinate to a surface Lewis base. The metal precursor then decomposes, leaving the central copper atom which acts as a nucleus for subsequent metallization (Gladfelter, W. L. *Chem. Mater.* 5 (1993) 1372).

The features and advantages of the invention are more fully illustrated by the following non-limited examples, wherein all parts and percentages are by weight, unless otherwise expressly stated.

EXAMPLE 1

Preparation of Chlorine-terminated Diamond Powder

A weighed aliquot (ca. 0.5 g typ.) of one of the diamond powders was placed into a tared quartz boat (8 cm×9 mm diameter) capped at the ends by a fine quartz frit. The boat was then placed into a quartz tube attached to a vacuum/gas manifold, similar to that shown schematically in FIG. 2. The tube was slowly evacuated to less than $1\times10^{-4}$ torr. Care was taken to avoid blowing the fine diamond powder. The tube was then slowly heated (15° C.min$^{-1}$) to 950° C. with constant pumping. The tube was maintained at 950° C. for 1 hour, then allowed to rapidly cool to room temperature (ca. 21° C.). The diffuse reflectance infrared spectrum of the resulting hydrogen-terminated diamond powder is shown as trace A of FIG. 4. The C—H stretching frequency is 2838 cm$^{-1}$.

After the tube had cooled, one atmosphere of chlorine gas was slowly introduced. The diamond was irradiated with principally 254 nm light from a high-pressure Hg arc lamp (Ace-Hanovia, medium arc, 450 W), at a distance of approximately 20 cm for 1–14 hours. After irradiation, the reactor tube surface had only increased to 28° C. from the heat of the UV lamp. The chlorine was then purged from the tube with argon through an aqueous NaOH scrubber for 5–15 minutes and the boat and powder weighed. The surface area of the powder had been previously measured to be 2.8 m$^2$/g, and this value was used to calculate the resulting chlorine loading in the chlorinated diamond powder:

| Chlorination conditions | Reaction Time (hr) | Observed Mass Change (% Δ) | Calculated Chlorine Loading (Cl · Å$^{-2}$) |
|---|---|---|---|
| Cl$_2$/hv | 1 | +0.055% | 0.033 |
| Cl$_2$/hv | 15 | +0.13% | 0.079 |

Figure 4:
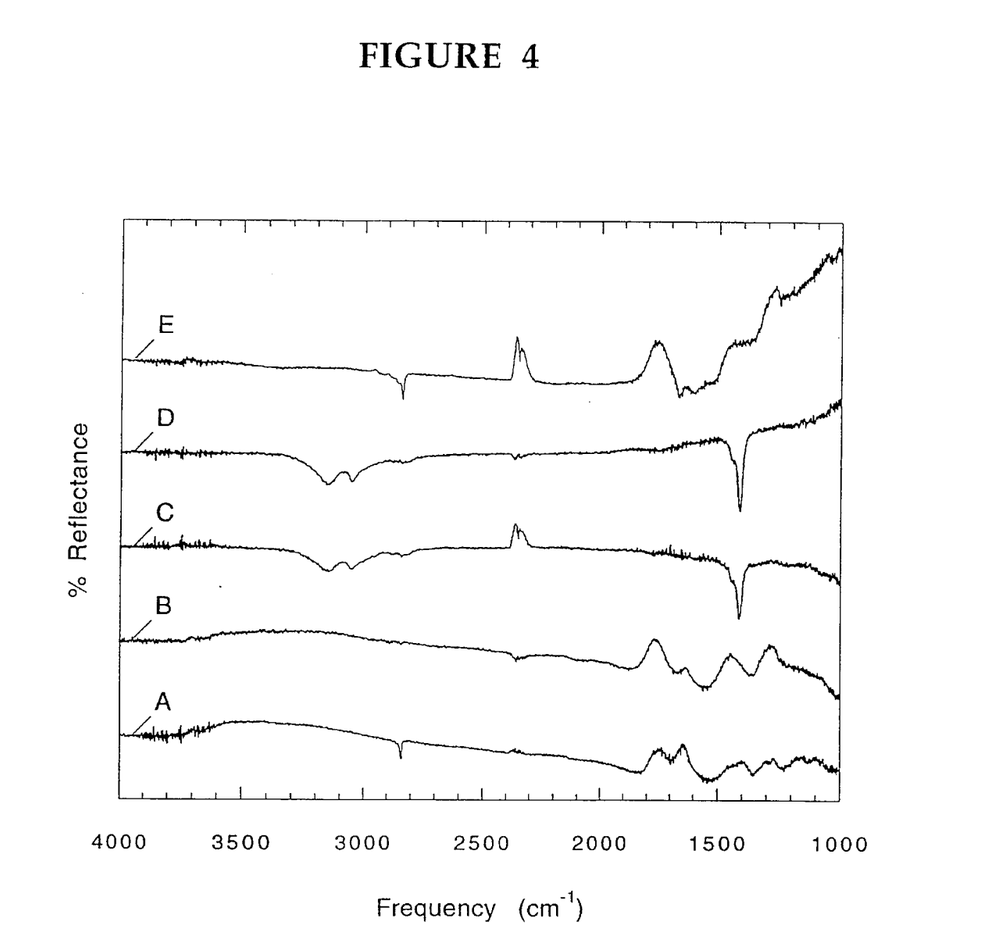
FIG. 4 shows diffuse infrared spectra of diamond powders versus reference materials, where trace A is hydrogen-terminated diamond vs. as received diamond, trace B is photochemically chlorinated diamond vs. as-received diamond, trace C is photochemically aminated diamond produced from thermally chlorinated diamond vs. thermally chlorinated diamond, trace D is photochemically aminated diamond produced from photochemically chlorinated diamond vs. photochemically chlorinated diamond, and trace E is the product resulting from heating photochemically chlorinated diamond in ammonia vs. photochemically chlorinated diamond.

The C—H stretching band disappeared from the infrared spectrum, which is shown as trace B in FIG. 4. Chlorination was difinitively indicated by the presence of a peak, characteristic of chlorine, near 2.6 keV in the energy-dispersive X-ray (EDX) spectrum and the Cl(2p) peak at 200.3 eV in the x-ray photoelectron (XPS) spectrum of the chlorine-treated powder.

EXAMPLE 2

Preparation of Chlorine-terminated Diamond Film

This process was identical to Example 1 except with the substitution of polycrystalline diamond film as the substrate for reaction. Any mass changes were too small to be reliably measured. However, the Cl(2p) peak at 200.3 eV in the x-ray photoelectron spectrum (XPS) of the reacted diamond film showed that its surface was chlorinated.

EXAMPLE 3

Preparation of Chlorine-terminated Diamond Single Crystals

Chlorine-terminated diamond single crystals were prepared by a process identical to Example 1 with the substitution of single crystal diamond of the three low-index crystallographic orientations (100), (110), (111) as the substrates for reaction. Any mass changes were too small to be reliably measured. However, the Cl(2p) peak at 200.3 eV in the XPS showed that the surface was chlorinated. There was systematic variation in the relative loading of surface chlorine, since the dangling bond density, and thus the number of potential sites for chemical modification, depend on the crystallographic orientation of the exposed surface.

| Chlorination conditions | Surface | Cl(2p$_{1/2}$) Energy (eV) | Cl/C Ratio (× 10$^2$)$^a$ |
|---|---|---|---|
| Cl$_2$/hv | C*(100) | 200.5 ± 0.2 | 11 ± 1.0 |
| Cl$_2$/hv | C*(110) | 200.2 ± 0.2 | 9.8 ± 1.0 |
| Cl$_2$/hv | C*(111) | 200.1 ± 0.2 | 7.1 ± 0.7 |

$^a$uncorrected for sensitivity.

EXAMPLE 4

Preparation of Amine-terminated Diamond Powders from Thermally Chlorinated Diamond A weighed aliquot (0.5 g typical) of diamond powder which had been outgassed for 1 hour at 950° C. in vacuo was placed into a tared quartz boat and thence into a quartz tube attached to a gas manifold. The tube was evacuated to less than $8\times10^{-5}$ torr, then rapidly heated to 425° C. under vacuum. One atmosphere of chlorine gas (Matheson Gases, 99.9%) was slowly introduced over several minutes. The chlorine was typically left in contact with the hot diamond for about an hour, after which the tube was allowed to cool rapidly to room temperature. The chlorine was then purged from the tube with argon through an aqueous NaOH scrubber for 5–15 minutes. The chlorinated diamond powder thus produced was spectroscopically indistinguishable from that prepared in Example 1. Similar mass changes were also observed. The presence of surface chlorine was confirmed by the 200.3 eV Cl(2p) peak in the XPS spectrum of the sample.

| Chlorination conditions | Time (hr) | Observed Mass Change (% Δ) | Calculated Chlorine Loading (Cl · Å$^{-2}$) |
|---|---|---|---|
| Cl$_2$/(425° C.) | 1 | +0.13% | 0.079 |
| Cl$_2$/(425° C.) | 15 | +0.15% | 0.091 |

A quartz tube containing an aliquot of the thermally-prepared, chlorine-terminated diamond powder was evacuated to less than $8\times10^{-5}$ torr and one atmosphere of ammonia gas was slowly introduced. The diamond was irradiated with a high-pressure Hg arc lamp, at a distance of approximately 20 cm for 3–16 hours. The ammonia was then purged from the tube with argon through a water scrubber for 3–5 minutes. The diffuse reflectance infrared spectrum of the amine-terminated diamond powder is shown as trace C of FIG. 4. The N—H stretching frequencies are 3145 and 3050 cm$^{-1}$. The NH$_2$ bending frequency is 1413 cm$^{-1}$. X-ray photoelectron spectroscopy revealed that the Cl(2p) peak at 200.3 eV was no longer present and that the N(1s) peak at 400.1 eV increased upon amination of the surface.

EXAMPLE 5

Preparation of Amine-terminated Diamond Powders from Photochemically Chlorinated Diamond An aliquot (0.5 g typical) of the chlorine-terminated diamond powder, prepared photochemically as in Example 1, was placed into a quartz boat and thence into the quartz tube of the reactor. The tube was evacuated to less than 8×10$^{-5}$ torr and one atmosphere of ammonia gas was slowly introduced. The diamond was irradiated with a high-pressure Hg arc lamp, at a distance of approximately 20 cm for 3–16 hours. The ammonia was then purged from the tube with argon through a water scrubber for 3–5 minutes. The infrared spectrum of this powder is identical to that produced in Example 4; it is shown as trace D in FIG. 4. Therefore, amination of the diamond surface by photochemically induced reaction of ammonia with a chlorine-terminated diamond surface does not depend on the route by which the chlorine-terminated diamond surface was prepared.

EXAMPLE 6

Preparation of Deuterium-labelled Amine-terminated Diamond Powders from Photochemically Chlorinated Diamond Deuterium-labelled amine-terminated diamond powders were prepared by a process was identical to that described in Example 5 except with the substitution of deuterium-labelled ammonia (ND$_3$) as the gas-phase reagent. The infrared spectrum of the powder thus obtained showed N—D streching frequencies of 2021 and 1977 cm$^{-1}$ and an ND$_2$ bending frequency of 1070 cm$^{-1}$, confirming the assignment of the N—H stretching and NH$_2$ bending peaks of the sample produced in Example 4. XPS revealed that the Cl(2p) peak at 200.3 eV was no longer present and that the N(1s) peak at 400.1 eV increased upon amination of the surface.

EXAMPLE 7

Preparation of Amine-terminated Diamond Film from Thermally Chlorinated Diamond

Amine-terminated diamond films were prepared by the process described in Example 4, with the substitution of polycrystalline diamond film as the substrate for reaction. X-ray photoelectron spectroscopy revealed that the Cl(2p) peak at 200.3 eV was no longer present and that the N(1s) peak at 400.1 eV increased upon amination of the surface.

EXAMPLE 8

Preparation of Amine-terminated Diamond Film from Photochemically Chlorinated Diamond This process was identical to Example 5 except with the substitution of chlorinated polycrystalline diamond film, prepared as in Example 2, as the substrate for reaction. X-ray photoelectron spectroscopy revealed that the Cl(2p) peak at 200.3 eV was no longer present and the the N(1s) peak at 400.1 eV increased upon amination of the surface.

EXAMPLE 9

Preparation of Amine-terminated Diamond Single Crystals from Thermally Chlorinated Diamond Amine-terminated diamond single crystals were prepared by the method of Example 4, with the substitution of photochemically chlorinated polycrystalline diamond film, prepared as in Example 2, as the substrate for reaction. X-ray photoelectron spectroscopy revealed that the Cl(2p) peak at 200.3 eV was no longer present and the the N(1s) peak at 400.1 eV increased upon amination of the surface.

EXAMPLE 10

Preparation of Amine-terminated Diamond Single Crystals from Photochemically Chlorinated Diamond Amine-terminated diamond single crystals were prepared by the method of Example 4, with the substitution of single-crystal diamond of the three low-index crystallographic orientations (100), (110), (111) as the substrates for reaction. X-ray photoelectron spectroscopy revealed that the Cl(2p) peak at 200.3 eV was no longer present and the the N(1s) peak at 400.1 eV increased upon amination of the surface. There was systematic variation in the relative loadings of surface amine, since the dangling bond density, and thus the number of potential sites for chemical modification, depend on the crystallographic orientation of the exposed surface.

| Surface | Ammonolysis Conditions | N(1s) Energy (eV) | N/C Ratio (× 10$^2$)[a] |
|---|---|---|---|
| C*(100) | NH$_3$/hv | 400.2 ± 0.2 | 9.7 ± 1.0 |
| C*(110) | NH$_3$/hv | 400.0 ± 0.2 | 9.8 ± 1.0 |
| C*(111) | NH$_3$/hv | 400.1 ± 0.2 | 7.5 ± 0.8 |

[a]uncorrected for sensitivity.

EXAMPLE 11

Attempted Preparation of Amine-terminated Diamond by Exposure of Chlorinated Diamond Powder to Ammonia at Elevated Temperatures Previous reports had appeared that described the thermal ammonia treatment of a chlorinated diamond surface. These reports, by the same authors—the first, in Russian (Makal'skii, V. I.; Loktev, V. in Bogatyreva, G. P., ed. *Vliyanie Khim. Fiz.-Khim Vozdeistv. Svoistva Almazov* (Akad. Nauk Ukr. SSR, Inst. Sverkhtverd. Mater.: Kiev, USSR, 1990) pp. 48–54), the second, in English, ("Surface Modification of Ultradispersed Diamonds," Loktev, V. F.; Makal'skii, V. I.; Stoyanova, I. V.; Kalinkin, A. V.; Likholobov, V. A.; Mit'kin, V. N. Carbon 29 (1991) 817)— report similar work and claim that the diamond surface may be aminated by heating a chlorine-terminated diamond surface in the presence of ammonia. These reports were inconsistent with each other and conflict with the findings of the inventor, and thus the thermal modification of a chlorine-terminated diamond surfaces was attempted, with careful spectroscopic analysis to determine whether amination had actually occurred.

Chlorinated diamond powders were heated to 450° C. in one atmosphere of NH$_3$(g) for 1 hour. The diffuse reflectance infrared spectrum of the powder produced in this example is shown as trace E of FIG. 4. This product appears to be hydrogen terminated, with a C—H stretching frequency of 2838 cm$^{-1}$ representing the most significant high-energy spectral feature. The spectrum of this product is very similar to that of the powders produced by the heat-treatment of the as-received diamond, as in Example 1. As verification of this assignment, the same procedure was followed using $ND_3(g)$, which resulted in a product having a C–D stretching frequency of 2115 cm$^{-1}$.

Therefore, it appears that thermal ammonolysis of the chlorine-terminated diamond surface merely regenerates a hydrogen-terminated surface. Photolysis is required to convert the halogen-terminated diamond surface to an amine-terminated diamond surface.

EXAMPLE 12

Use of Chlorine-termination to Change Diamond Film-gold Contact Barrier from Ohmic to Schottky A chlorine-terminated boron-doped-polycrystalline diamond film was prepared according to Example 2, except that the film was not heated in vacuo prior to the chlorination process. An identical polycrystalline diamond film was left unmodified. A series of 1 µm thick gold pads were deposited onto each of the films, and the current versus voltage characteristics of the resulting structures (shown schematically in FIG. 3) were measured. The current vs voltage (I-V) curves measured between two gold pads on the unmodified diamond film were linear, indicative of an ohmic contact. The I-V curves measured between two gold pads on the chlorine-terminated diamond film were sigmoidal, indicative of a Schottky barrier.

EXAMPLE 13

Use of Chlorine Termination to Change the Specific Contact Resistance Between a Diamond Film and a Gold Electrode A chlorine-terminated boron-doped polycrystalline diamond film was prepared according to Example 2, including the in vacuo heat treatment prior to the chlorination process (in contrast to Example 12). An identical polycrystalline diamond film was left unmodified. A series of 1 µm thick gold pads were deposited onto each of the films, and the current versus voltage characteristics of the resulting structures were measured at various contact separations. For both films, the contacts between the gold pads and the unmodified diamond films were ohmic. The specific contact resistance of the chlorine-terminated film was 11% higher than the contact resistance on the unmodified film, as determined by extrapolating the I-V slope versus pad-spacing data to zero pad separation.

EXAMPLE 14

Use of Amine Termination to Change the Specific Contact Resistance Between a Diamond Film and a Gold Electrode An amine-terminated boron-doped polycrystalline diamond film was prepared according to Example 5. An identical polycrystalline diamond film was left unmodified. A series of 1 µm thick gold pads were deposited onto each of the films, and the current versus voltage characteristics of the resulting structures were measured at various contact separations. For both films, the contacts between the gold pads and the unmodified diamond films were ohmic. The specific contact resistance of the amine-terminated film was 19% higher than the contact resistance on the unmodified film.

EXAMPLE 15

Use of Amine Termination to Change the Specific Contact Resistance Between a Diamond Film and a Platinum Electrode An amine-terminated boron-doped polycrystalline diamond film was prepared according to Example 5. An identical polycrystalline diamond film was left unmodified. A series of 1 µm thick platinum pads were deposited onto each of the films, and the current versus voltage characteristics of the resulting structures were measured at various contact separations. For both films, the contacts between the platinum pads and the unmodified diamond films were ohmic. The specific contact resistance of the amine-terminated film was 12% higher than the contact resistance on the unmodified film.

EXAMPLE 16

Amine-termination to Enhance Gold Adhesion to Diamond Films

A chlorine-terminated polycrystalline diamond film was prepared according to Example 2. An amine-terminated polycrystalline diamond film was prepared according to Example 7. A polycrystalline diamond film was left unmodified. A 1 µm thick gold layer was deposited onto each of the films. A 300 µm gold ribbon was then thermosonically bonded to the gold layer, and a pull-test for adhesion performed. There are three components under test in this system: film-pad adhesion, pad-ribbon bond and the ribbon tensile strength. During a pull-test, the weakest component will fail first. (The pad-ribbon bond did not fail in any test performed herein.) The metal film peeled from the unmodified and the chlorine-terminated films. The gold ribbon failed while testing the adhesion of the gold pad to the amine-terminated film; the gold pad did not peel from amine-terminated diamond.

While the invention has been described herein with reference to specific aspects, features, and embodiments, it will be apparent that other variations, modifications, and embodiments are possible, and all such variations, modifications, and embodiments therefore are to be regarded as being within the spirit and scope of the invention.

What is claimed is:

1. A surface-modified diamond or diamond-like material having (i) a chemically modified surface which is aminated with chemically bonded surface functional groups comprising amine functionality, and (ii) a bulk volume beneath said chemically modified surface wherein said bulk volume lacks such amine functionality therein, and wherein said chemically modified surface is characterized by an infrared spectrum including N—H stretch spectral peaks in the vicinity of 3150-CM$^{-1}$ and 3050-CM$^{-1}$.

2. A diamond or diamond-like material according to claim 1, wherein the aminated surface comprises from about $2 \times 10^{12}$ to about $2 \times 10^{15}$ amine functional groups per cm$^2$ of said surface.

3. A diamond or diamond-like material according to claim 1, wherein the aminated surface comprises amine functionalities of the formula —$NR_2$, wherein each R is independently selected from the group consisting of hydrogen, substituted or unsubstituted hydrocarbyl, azine, and sulfonamide.

4. A diamond or diamond-like material according to claim 3, wherein hydrocarbyl is selected from the group consisting of $C_1$–$C_{18}$ alkyl, $C_2$–$C_{18}$ alkenyl, $C_6$–$C_{20}$ aryl, and $C_3$–$C_{18}$ cycloalkyl.

5. A diamond or diamond-like material according to claim 1, wherein the aminated surface comprises amine functionalities selected from those of the formulae:

(a) $(\eta\text{-}C_5H_5)M(\eta\text{-}C_5H_4(CH)_n NH\text{---})$; and (b) $(\eta\text{-}C_6H_6)M(\eta\text{-}C_6H_5(CH)_n NH\text{---})$, where M is transition metal and n ranges from 1 to 8.

6. A diamond or diamond-like material according to claim 5, wherein the metal is selected from the group consisting of metals from group VIB, VIIB, and VIIIB of the Periodic Table.

7. A diamond or diamond-like material according to claim 2, wherein the amine functional groups are photolithographically patterned on the surface.

* * * * *